United States Patent [19]

Goerz et al.

[11] Patent Number: 6,060,791
[45] Date of Patent: May 9, 2000

[54] ULTRA-COMPACT MARX-TYPE HIGH-VOLTAGE GENERATOR

[75] Inventors: David A. Goerz, Brentwood; Michael J. Wilson, Modesto, both of Calif.

[73] Assignee: The Regents of the University of California, Oakland, Calif.

[21] Appl. No.: 09/034,797

[22] Filed: Mar. 3, 1998

[51] Int. Cl.$^7$ .................................................. H02M 3/18
[52] U.S. Cl. .......................................... 307/110; 361/326
[58] Field of Search .................................... 307/106, 108, 307/109, 110; 327/100, 124, 181, 291, 544; 361/117, 120, 326, 301.1

[56] References Cited

U.S. PATENT DOCUMENTS

| | | | |
|---|---|---|---|
| 3,068,369 | 12/1962 | Hoffmann . | |
| 4,645,941 | 2/1987 | Nicolas | 307/110 |
| 4,900,947 | 2/1990 | Weiner et al. | 307/110 |
| 5,153,460 | 10/1992 | Bovino et al. | 307/108 |
| 5,311,067 | 5/1994 | Grothaus et al. | 307/108 |
| 5,621,255 | 4/1997 | Leon et al. | 307/160 |
| 5,798,579 | 8/1998 | McPhee | 307/106 |

FOREIGN PATENT DOCUMENTS

| | | |
|---|---|---|
| 1580397 | 9/1969 | France . |
| 2098513 | 3/1972 | France . |
| 2569319 | 2/1986 | France . |
| 581861 | of 0000 | United Kingdom . |

OTHER PUBLICATIONS

S.M. Turnbull et al., Development of a High Voltage, High PRF PFN Marx Generator, Conference Record of the 1998 23rd Int'l Power Modulation Symposium, pp. 213–16\.

Graham et al., Compact 400 KV Marx Generator With Common Switch Housing, Pulsed Power Conference, 11th Annual Digest of Technical Papers 1997, vol. 2, pp. 1519–1523.

CNess, et al. Compact, Megavolt, Rep–Rated Marx Generators, IEEE Transactions on Electron Devices, vol. 38, No. 4, 1991, pp. 803–809.

Shkaruba et al, "Arkad'ev–Mark Generator with Capacitive Coupling," Instrum Exp Tech May–Jun. 1985, vol. 28, No. 3 part 2, May 1985, pp. 625–628, XP002080293.

I. C. Sumerville, "A Simple Compact 1MV, 4kJ Marx," Proceedings of the Pulsed Power Conference, Monterey, California, Jun. 11–24, 1989, No. conf. 7, Jun. 11, 1989, pp. 744–746, XP000138799.

*Primary Examiner*—Jeffrey Gaffin
*Assistant Examiner*—Peter Zura
*Attorney, Agent, or Firm*—John P. Wooldridge

[57] ABSTRACT

An ultra-compact Marx-type high-voltage generator includes individual high-performance components that are closely coupled and integrated into an extremely compact assembly. In one embodiment, a repetitively-switched, ultra-compact Marx generator includes low-profile, annular-shaped, high-voltage, ceramic capacitors with contoured edges and coplanar extended electrodes used for primary energy storage; low-profile, low-inductance, high-voltage, pressurized gas switches with compact gas envelopes suitably designed to be integrated with the annular capacitors; feed-forward, high-voltage, ceramic capacitors attached across successive switch-capacitor-switch stages to couple the necessary energy forward to sufficiently overvoltage the spark gap of the next in-line switch; optimally shaped electrodes and insulator surfaces to reduce electric field stresses in the weakest regions where dissimilar materials meet, and to spread the fields more evenly throughout the dielectric materials, allowing them to operate closer to their intrinsic breakdown levels; and uses manufacturing and assembly methods to integrate the capacitors and switches into stages that can be arranged into a low-profile Marx generator.

35 Claims, 6 Drawing Sheets

ULTRA-COMPACT MARX-TYPE HIGH-VOLTAGE GENERATOR

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates generally to Marx-type generators, and more particularly to an extremely compact Marx generator comprised of specially shaped components assembled into an integrated package. The invention particularly relates to (i) high-performance ceramic capacitors, (ii) high-performance miniature gas switches that can be repetitively operated, (iii) high-performance solid dielectric switches that can be operated with high-reliability, (iv) methods for coupling energy from stage-to-stage to overcome difficulties in switching successive stages, and (v) methods for manufacturing these high-performance components where electric field stresses are eliminated or sufficiently reduced in the so-called weak areas.

2. Description of Related Art

Conventional Marx-type high voltage generators use a voltage multiplier configuration in which many capacitors are charged in parallel to the input voltage, then the charged capacitors are switched into a series configuration to generate a high-voltage output about equal to the sum of the voltages across each of the capacitors. In principle, Marx generators are simple, and their capability is largely determined by the performance of the individual energy storage capacitors and switches used in each stage. But, a high-performance Marx generator that can store a rather large amount of energy in a relatively compact enclosure, produce a very high voltage in a relatively small enclosure and deliver a large current pulse with a relatively fast response time is quite difficult to build.

The performance that can be obtained from Marx generators ultimately depends on the physical layout and construction details as well as strengths of materials. Marx generators are often constructed with standard, commercially available components that are orderly arranged into compact assemblies. Because such components are made for general use, their packaging and terminal styles are not optimum for highly specialized applications that require very high voltages in very small spaces and very low inductance interconnections. The overall system performance of a Marx generator can be significantly improved by manufacturing special components that are designed to be part of an integrated package that uses dielectrics to their maximum advantage, minimizes inductances, and tightly controls stray capacitances.

Spark gaps are the most frequently used switches in repetitively operated Marx generators, and basically consist of two metal electrodes separated by a gap filled with pressurized gas, all in a dielectric housing. The spark-gap switch operates when the electric field in the gap exceeds the breakdown level of the dielectric gas. A spark gap component is generally much larger than the actual gap breakdown region within. This is a consequence of having to provide a suitable structural housing to support the electrodes and contain the pressurized gas. To make spark gaps hold off higher voltages, path lengths along the gas envelope surface or through the housing material must be made reasonably long, which increases the inductance of the switch and limits the performance of the Marx generator. Low-profile, low-inductance switches are needed for compact, high-performance Marx generators.

The physical layout of components is one element that directly affects the inductances and stray capacitances distributed within a Marx generator. In conventional Marx generators a delicate balance between the stray stage-to-housing capacitance and the interstage (switch) capacitance needs to be achieved for proper operation. Generally, the stray stage-to-housing capacitance must be large enough, and the switch capacitance small enough to achieve sufficient voltage increase across the next in-line switch to cause it to operate as a result of impulse coupling from the voltage collapse across the nearby switch that has already operated. Thus, each switch that operates triggers the next switch to operate in a progressive fashion that allows the Marx bank to erect properly.

Ordinarily, in conventional Marx generators the switch capacitance is low enough that stray stage-to-housing capacitance is adequate to couple enough voltage across adjacent switches to cause them to operate. However, in an ultra-compact Marx generator the extremely low-profile switch would have a switch capacitance so large that it becomes impractical to balance it out with a sufficient stray stage-to-housing capacitance. But this shortcoming can be overcome in the present invention by incorporating discrete feed-forward coupling capacitors across stages that effectively augments the stray capacitance and thus reduces the ill-effects of the increased low-profile switch capacitance.

The performance of any ultra-compact Marx generator can be no better than the strength of the materials being used, and the electrical or mechanical stresses they are exposed to. Materials selection is a highly developed art, less developed are ways to reduce stresses that allow the selected materials to do their job more effectively. However, the dielectric constant and strength of the capacitor material are very important because they co-determine the amount of energy that can be stored. The energy stored in capacitors typically increases in direct proportion to the dielectric constant and in proportion to the square of the dielectric strength. The dielectric strengths of the insulating materials used for the switches and housing are also quite important. In order to achieve the maximum overall energy density it is desirable to operate near the intrinsic breakdown levels of the materials, e.g., at the highest voltages possible.

The electric field stresses usually cause the most trouble in the critical regions where dissimilar materials meet, particularly at so-called triple-point regions where a metal electrode and two different dielectric materials are in direct proximity. At these locations electric field stresses can become severely enhanced, increasing as much as the ratio of the dielectric constants of the different materials, or more, depending on the shapes of the materials. In conventional Marx generators, the field enhancements are not of tremendous importance because spacings are usually sufficiently great, and appropriate safety factors are applied so that the weakest material is not overstressed; however, this generally results in a sacrifice of volumetric energy density. In the present invention, the adjoining metal and dielectric materials are specially shaped to reduce the electric fields at the triple-point regions to levels that are below the breakdown threshold of the weakest material at the triple-point regions. The electric fields in the weakest regions are preferably spread throughout the stronger regions, e.g., in the bulk of the dielectric materials themselves, rather than at their interfaces.

Another problematic area where electric field stresses can lead to failure is in the placement or attachment of electrodes next to solid dielectric materials such as the switch housings. Customarily, when the dielectric material of the switch housing is pressed or mechanically attached between electrodes, there exists small voids that fill with some other material, typically the gas or liquid used to insulate the entire Marx assembly. Usually this void filling material has a lower electrical strength than the solid dielectric material, and the electrical field in this highly stressed region may easily exceed the electrical strength of the void filing material. Moreover, for gas and many liquids having a lower dielectric constant than the solid dielectric, there can be a field concentration in the void region that enhances the likelihood of breakdown in this weaker material. By metalizing the surfaces of the solid dielectric materials in the present invention, wherever contact is to be made with metal electrodes, the electric fields are eliminated in the void regions, thus preventing electrical discharge (corona) activity that can lead to breakdown of the bulk dielectric material.

Solid-dielectric switches, where the dielectric material itself is what breaks down under an over-voltage condition, have never before been reported as being used in a Marx-type generator. However, for single-action operation, solid dielectric switches offer high reliability and extremely low inductance. Solid dielectrics usually can withstand, and then switch, substantially higher voltages than either gas or liquid dielectrics in a spark gap switch. Many plastics have intrinsic breakdown levels as high as 1 to 10 MV/cm, whereas a gas such as sulfur hexafluoride ($SF_6$) has a breakdown level of approximately 75 kV/cm per atmosphere of pressure. The difficulty has always been that switches for a Marx generator must be able to operate reliably at a predetermined over-voltage level, and the standard deviation in operating level must be rather small, typically four to six percent, in order to be assured that all of the switches can be properly over-voltaged so the Marx bank erects reliably. By proper design and manufacturing of a controlled region of enhanced electrical stress, dielectric switches can be made reliable enough to be used in a Marx-type high-voltage generator.

SUMMARY OF THE INVENTION

An object of the present invention is to provide a very compact Marx-type high-voltage generator.

A further object of the present invention is to provide a method for increasing the high-voltage performance of various capacitors, switches, and insulating structures.

Briefly, the present invention comprises an ultra-compact Marx-type high-voltage generator in which individual high-performance components are closely coupled and integrated into an extremely compact assembly.

In one embodiment, a repetitively-switched, ultra-compact Marx generator includes low-profile, annular-shaped, high-voltage, ceramic capacitors with contoured edges and coplanar extended electrodes used for primary energy storage; low-profile, low-inductance, high-voltage, pressurized gas switches with compact gas envelopes suitably designed to be integrated with the annular capacitors; feed-forward, high-voltage, ceramic capacitors attached across successive switch-capacitor-switch stages to couple the necessary energy forward to sufficiently overvoltage the spark gap of the next in-line switch; optimally shaped electrodes and insulator surfaces to reduce electric field stresses in the weakest regions where dissimilar materials meet, and to spread the fields more evenly throughout the dielectric materials, allowing them to operate closer to their intrinsic breakdown levels; and uses manufacturing and assembly methods to integrate the capacitors and switches into stages that can be arranged into a low-profile Marx generator.

In another embodiment, a reliable single-action ultra-compact Marx generator includes low-profile, disk-shaped, high-voltage, ceramic capacitors with contoured edges and coplanar extended electrodes used for primary energy storage; very low-profile, low-inductance, high-voltage, solid dielectric switches suitably designed to be integrated with the disk capacitors; feed-forward, high-voltage, ceramic capacitors attached across successive switch-capacitor-switch stages to couple the necessary energy forward to sufficiently overvoltage the breakdown region of the next in-line switch; optimally shaped electrodes and insulator surfaces to reduce electric field stresses in the weakest regions where dissimilar materials meet, and to spread the fields more evenly throughout the dielectric materials, allowing them to operate closer to their intrinsic breakdown levels; and uses manufacturing and assembly methods to integrate the capacitors and switches into stages that can be arranged into a low-profile Marx generator.

A major advantage of the present invention is that a Marx generator is provided with relatively much higher voltage and delivered energy outputs for its size. A key attribute of the present invention is that it exhibits an especially low inductance through the use of low-profile capacitors and very-low-profile switches, thus resulting in fast energy delivery and high frequency operation. Another key attribute of the present invention is that it uses discrete feed-forward coupling capacitors across successive stages to overcome the relatively large capacitance of such low-profile switches and assist in initiating operation of successive switches. Another key attribute of the present invention is that it makes use of metalized regions over surfaces of dielectric material that will be attached to or in direct contact with adjoining metal electrodes, thus eliminating any electric field from the void region between the primary dielectric insulation and the adjacent metal electrodes where a weaker dielectric medium may exist. Another key attribute of the present invention is a highly-reliable, nominally 100-kV solid-dielectric switch having an overall height of one millimeter in which the standard deviation in operating voltage is better than 6.8%.

DETAILED DESCRIPTION OF THE INVENTION

Figure 1:
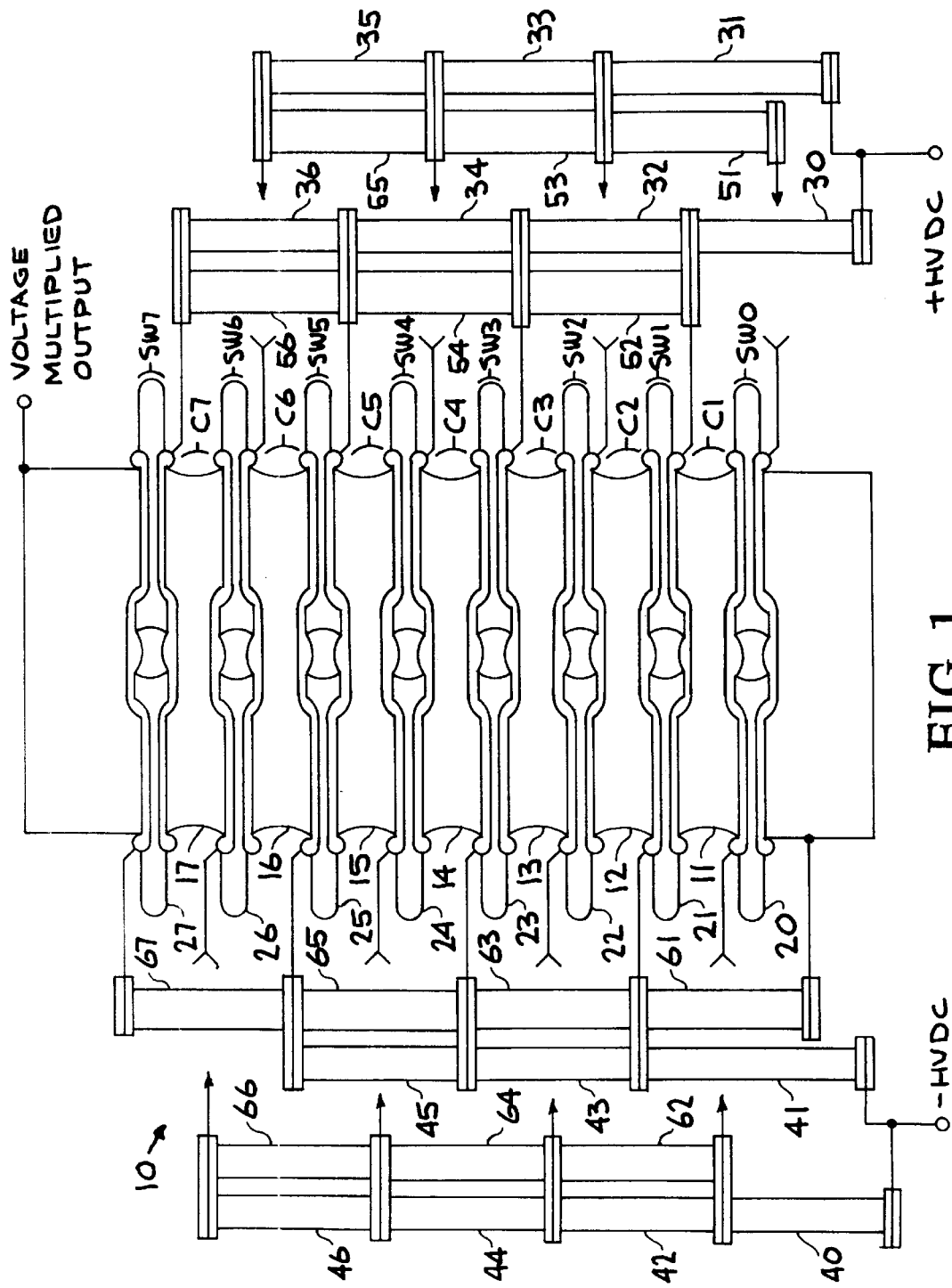
FIG. 1 is a cross sectional diagram of a seven stage Marx generator embodiment of the present invention illustrating how the components interconnect to form an integrated Marx generator.
Figure 2:
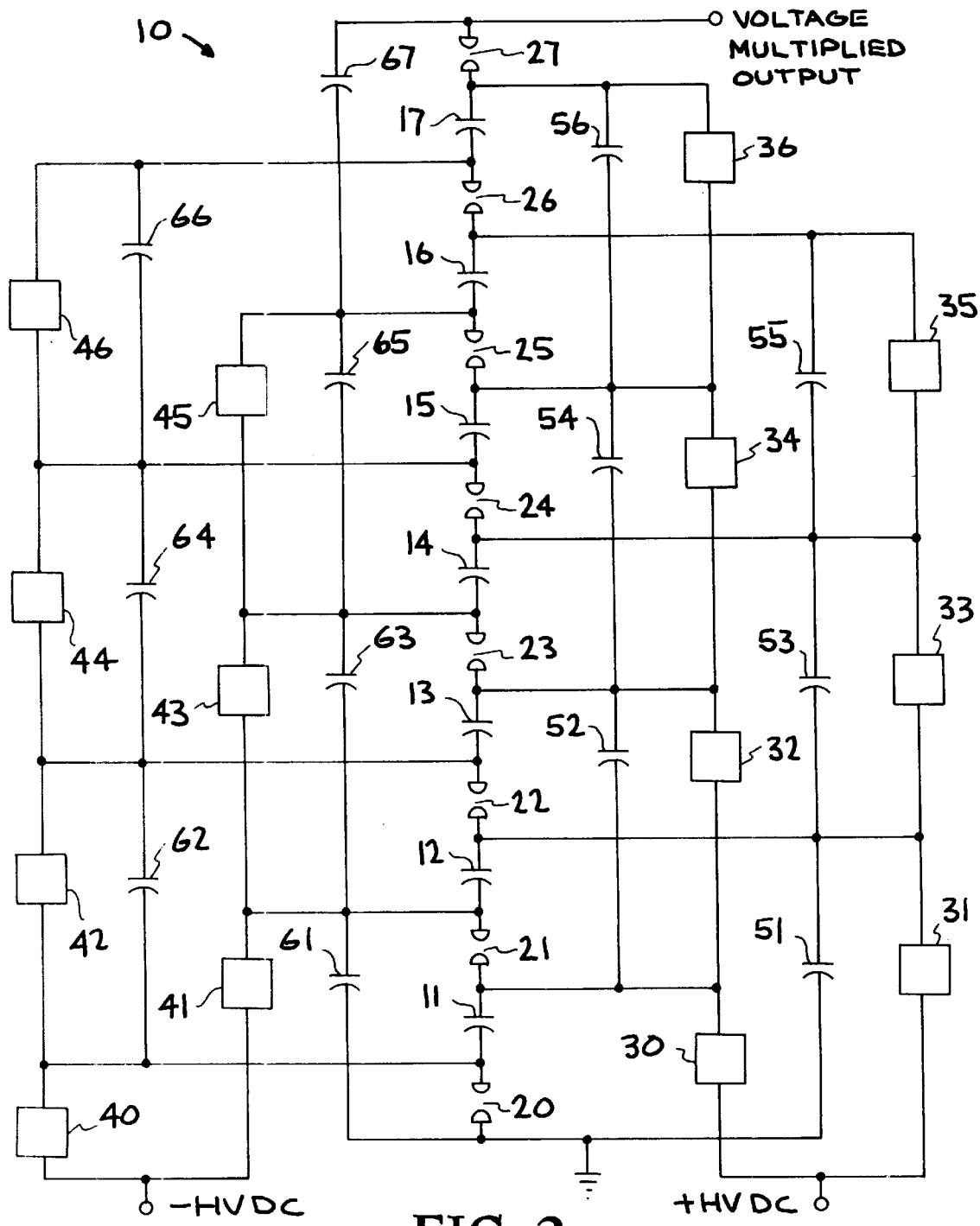
FIG. 2 is a schematic diagram of the seven stage Marx generator.

FIG. 1 illustrates a compact Marx-type high-voltage generator embodiment of the present invention, and is referred to herein by the general reference numeral 10. FIG. 2 is a schematic diagram of the seven stage Marx generator showing how the components connect electrically. The compact Marx-type high-voltage generator 10 depicted here comprises a set of seven energy storage capacitors (C1–C7) 11–17 that are charged in parallel by high voltage power supply inputs and then momentarily switched into a series configuration by a set of eight high voltage switches (SW0–SW7) 20–27. Such capacitors are constructed of solid high-permittivity ceramic with extended brass electrodes suitably shaped to match the profile of the switches. The capacitors (C1–C7) 11–17 are typically made of barium-titanate or strontium-titanate perovskite ceramics which exhibit ferroelectric behavior and have a relatively high dielectric constant (1500 to 3000) and relatively high dielectric strength (75 to 150 kV/cm).

A first set of charging elements 30–36 allows the top electrode of each capacitor (C1–C7) 11–17 to charge to the level of the positive high voltage power supply input under direct current (DC) steady state or impulse charging conditions. Similarly, a second set of charging elements 40–46 connects the bottom electrode of each capacitor (C1–C7) 11–17 to the negative high voltage power supply input under the same direct current (DC) steady state or impulse charging conditions. The charging elements 30–36 and 40–46 can be resistors on the order of 5 to 100 kilo-ohms depending on the desired charging time and output pulse duration. Alternately, the charging elements 30–36 and 40–46 can be inductors on the order of 1 to 20 microhenrys for faster charging times and higher repetition rates so long as the desired output pulse duration is sufficiently brief. Different combinations of positive and negative high-voltage power supply levels are possible with this same configuration. For example, the positive and negative power supplies could have equal magnitude outputs of 50 kV, or the negative supply could have an output of 100 kV while the positive supply could have an output of zero volts or be replace by a ground connection. Under charged conditions, the voltage applied to each switch (SW0–SW7) 20–27 is preferably high enough to stress the dielectric medium of the switch but not cause it to break down without an increased voltage being momentarily applied.

Discrete 'feed-forward' coupling capacitors 51–56 and 61–67 are attached across successive stages of switches and energy storage capacitors. When any switch 20–27 is triggered to close, one or more of these forward-coupling capacitors 51–56 and 61–67 will cause an impulse voltage waveform to be applied across adjacent switches. Preferably, the switches are designed to be under-stressed at DC conditions and over-stressed when any one adjacent switch closes. The object is to have the triggering of any switch 20–27 precipitate the closing of the others by a voltage over-stressing and breakdown mechanism. For example, when switch (SW4) 24 closes, forward-coupling capacitor 45, which connects between the top electrode of (SW3) 23 and the top electrode of (SW5) 25, will cause the voltage across (SW5) 25 to increase some amount due to the voltage collapse of (SW4) 24. Likewise, when switch (SW4) 24 closes, forward-coupling capacitor 55, which connects between the bottom electrode of (SW4) 24 and the bottom electrode of (SW6) 26, will cause the voltage across (SW5) 25 to increase some amount due to the voltage collapse of (SW4) 24. The amount of voltage developed across adjacent switches depends on the switch capacitance and the values of the forward-coupling capacitors. For very-low-profile switches like the ones employed in the ultra-compact Marx generator, switch capacitance can range up to about 200 pF, and forward-coupling capacitors need to be about that same amount.

Figure 3:
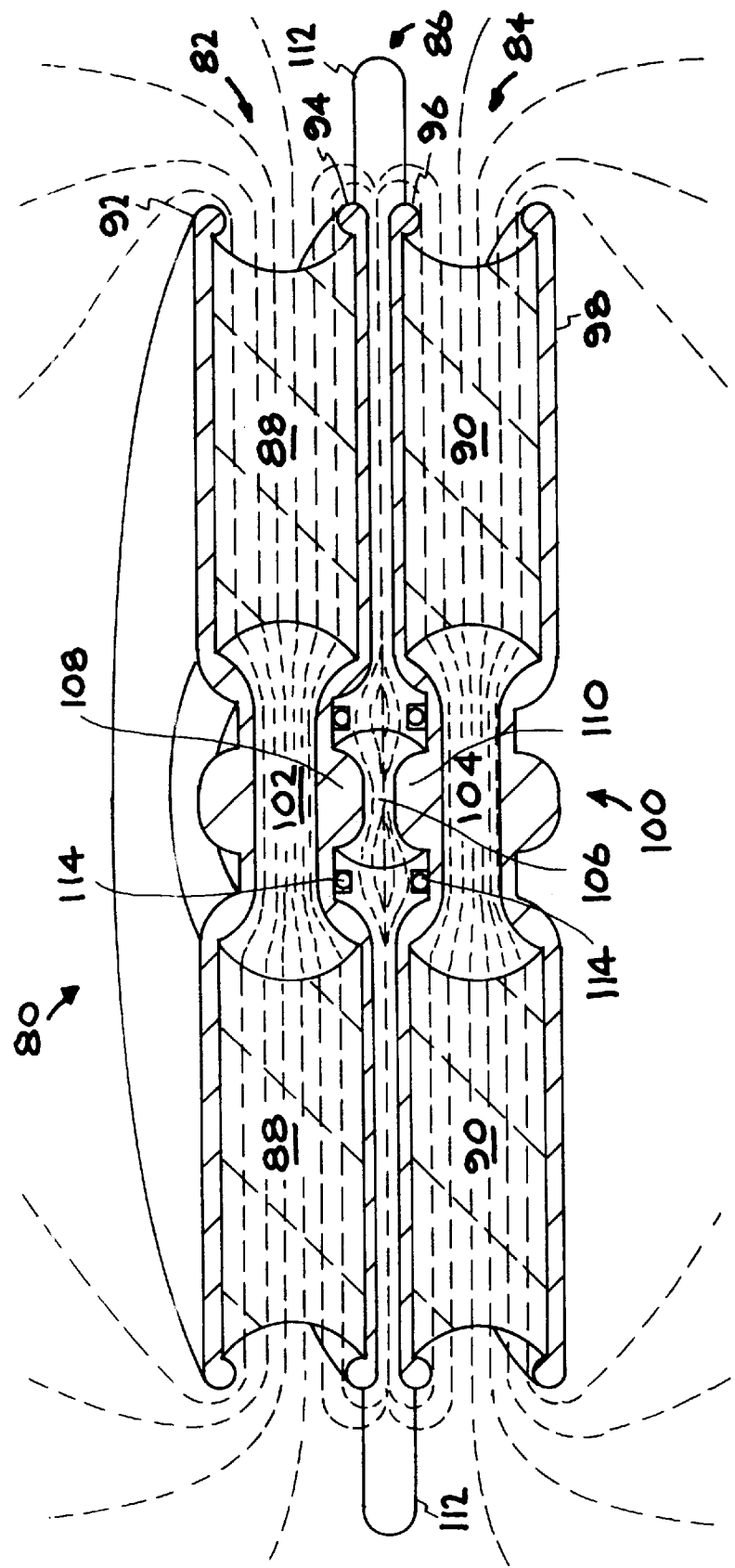
FIG. 3 is a cross sectional diagram illustrating a circuit with a pair of capacitors and a gas switch in a circuit embodiment of the present invention.

FIG. 3 illustrates a circuit 80 which comprises a pair of capacitors 82 and 84 connected by a gas switch 86. A system of dashed lines 81 is shown in FIG. 3 that represents the voltage gradient contours calculated for the circuit 80. Each capacitor 82 and 84 is constructed of a flat annular cylinder (e.g., a washer shape) of solid ceramic dielectric material 88 and 90. It is critical to the present invention that each flat annular cylinder of solid ceramic dielectric material 88 and 90 have their respective top and bottom surfaces completely metalized such that any of a set of conductor electrodes 92, 94, 96, and 98 cannot contact any bare unmetallized surface of the flat annular cylinder of solid dielectric materials 88 and 90. A central core 100 is filled with a high performance gas dielectric such as sulfur hexaflouride ($SF_6$). Such gas fills a pair of capacitor interstitial chambers 102 and 104, and also a switch chamber 106. A button electrode 108 protrudes into the switch chamber 106 from above, and button electrode 110 protrudes into the switch chamber 106 from below. When the gas switch 86 operates, a breakdown in the gas dielectric occurs, and an electric arc establishes between the electrodes 108 and 110. The gap between the electrodes 108 and 110, is sized according to the intended operating voltages, gas pressure, and gas species. A nominal gap of 2.0 mm will normally breakdown at 100 kV with $SF_6$ pressurized to 100 PSIA.

The gas switch 86 comprises a solid dielectric 112 sandwiched between the two metal electrodes 94 and 96 that are attached to the two capacitors 82 and 84. If the gas dielectric in the core region 100 is different in type or pressure than the dielectric medium surrounding the rest of the assembly, a set of o-rings 114 are used to contain the gas dielectric in the core 100. If the gas dielectric in the core region 100 is the same as the dielectric medium surrounding the rest of the assembly, the o-rings 114 can be omitted. The separation distance between the parallel top and bottom surfaces of the gas switch 86 is typically 2.0 mm, and can be subjected to electric stress levels averaging 500 kV/cm for charge voltages of 100 kV. The electric stress levels at the radiused corners of the metal electrodes 94 and 96 become enhanced about 20 percent so the peak electric stress levels at these locations can be about 600 kV/cm.

The imposed electric stress levels must be kept below the breakdown limits of the dielectrics, and the shape of the metallic and dielectric parts is crucial to the beneficial management of the electric fields. With an applied voltage of 100 kV, the electrical field at the triple point of the switch chamber 106, the plastic 112 and the electrodes 94 and 96, is reduced below about 30 kV/cm. Also, the electric field along the envelope interface of the switch chamber 106 and the plastic 112 is less than about 150 kV/cm.

Figure 4A:
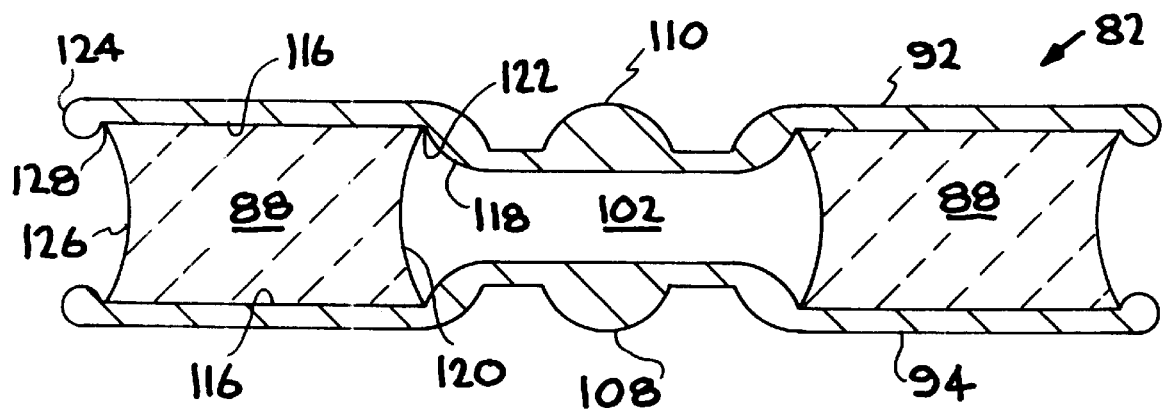
FIG. 4A is a cross sectional diagram of a low-profile annular ceramic capacitor with suitably shaped electrodes to accommodate an imbedded gas switch for a repetitively operated Marx generator.

FIG. 4A is a cross sectional diagram of a low-profile annular ceramic capacitor 82 with suitably shaped electrodes to accommodate the low-profile imbedded gas switch 86 (as shown in FIG. 3) for a repetitively operated Marx generator. The low-profile shape of the capacitor gives it a relatively low inductance, resulting in fast energy delivery and high frequency operation. For example, in one embodiment of the present invention, a 1-cm-tall, 5-cm-diameter annular ceramic capacitor is designed to operate at about 60 to 80 kV and has an intrinsic inductance of about 3.5 nanohenries, and a self resonance frequency of about 55 MHz.

The ceramic material 88 has a high dielectric strength resulting in high-voltage operation in a thin, low-profile package. It also has a high-dielectric-constant for relatively high capacitance in a rather small volume and could be comprised of any class of high-permittivity ceramic, including barium titanate, strontium titanate, lead-magnesium-niobate, or various other types of ferroelectric materials. For example, in one embodiment of the present invention, a 1-cm-tall, 5-cm-diameter annular capacitor made of N4700-class material meeting EIA standards for X7R ceramic has a capacitance of 2.5 nF at low operating voltages and 1.7 nF operating at electric stress levels of 60 kV/cm. Ceramic material 88 has metalized regions 116 that will be attached to or in direct contact with metal electrodes.

The preferred method of metalizing the surfaces 116 of the ceramic material 88 employs a strictly chemical process for plating copper on surfaces exposed in a chemical bath, also known as electroless chemical plating since it does not use electrolysis for depositing the metal. Other methods for metalizing surfaces of ceramic dielectric materials can be employed, such as depositing and baking metal-based inks, physical vapor deposition, chemical vapor deposition, plasma-assisted vapor deposition and plasma-arc spraying of metal powders in a vacuum chamber. Other materials for metallic coatings can be employed, such as aluminum, nickel, silver, and gold.

A pair of metal electrodes 92 and 94 are attached to the metalized surfaces 116 of the ceramic substrate 88. The electrodes 92 and 94 are essentially parallel to one another and extend beyond the edges of the dielectric material. The preferred method of attaching the metal electrodes 92 and 94 to the metalized surfaces 116 of the ceramic substrate 88 uses low-temperature solder. Other methods for attaching metal electrodes to the metalized surfaces of the ceramic substrate can be employed, such as metal-based epoxy or flexible conductive layers with some means to apply constant force to achieve a mechanical connection. The extended metal electrodes 92 and 94 have radiused corners at the edges 118 and 124 to control the electric field at the triple-point junctions 122 and 128 where three dissimilar materials meet. The objective is to reduce the electric field sufficiently so that electrical breakdown will not occur in the vicinity of the edge of the ceramic dielectric surface.

The ceramic substrate 88 also has contoured edges 120 and 126 shaped to further control the electric field at the triple-point junctions 122 and 128 where three dissimilar materials meet and to reduce the electric field sufficiently so that electrical breakdown will not occur in the vicinity of the edge of the ceramic dielectric surface. Alternately, straight edges can be used with some sacrifice in achievable high voltage level and performance, but perhaps with some savings in manufacturing costs.

Different means are available by which to manufacture ceramic substrates of high quality and to machine, grind, or otherwise form contoured shapes along the inner and outer edges. Such methods include 1) hydraulic pressing of ceramic powders into pill-shaped substrates followed by sintering at high temperature, then machining or grinding the surfaces to the final shape, 2) hydraulic pressing of multiple stacked layers of sections of thin ceramic tape, followed by sintering at high temperature, then machining or grinding the surfaces to the final shape, and 3) isostatic pressing of ceramic powder mixed with binding agents to form disks or cylinders of ceramic 'greenware' which is subsequently machined to near net shape, followed by sintering at high temperature, then machining or grinding to the final shape.

Figure 4B:
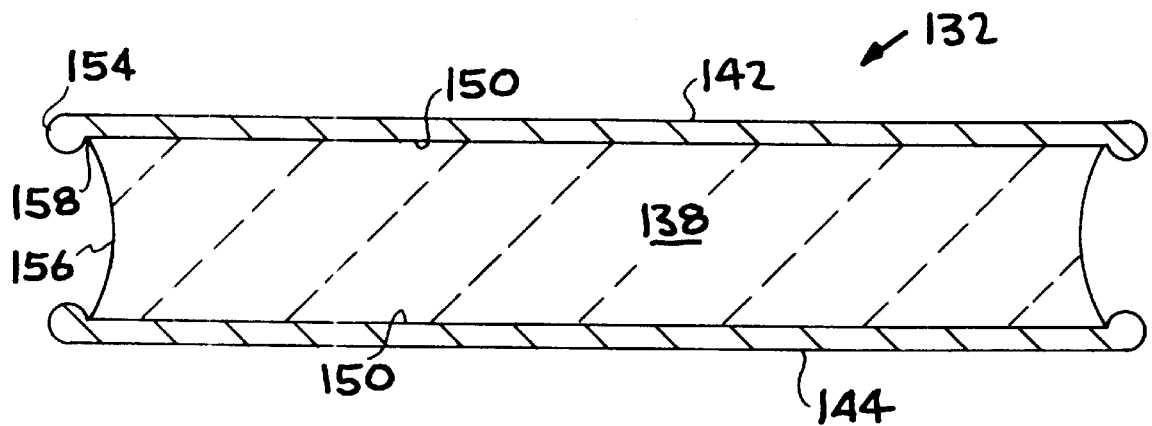
FIG. 4B is a cross sectional diagram of a low profile disk ceramic capacitor with extended coplanar electrodes for use with solid-dielectric switches for reliable single action Marx generator operation.

FIG. 4B is a cross sectional diagram of a low-profile disk ceramic capacitor 132 with suitably shaped electrodes to accommodate the low-profile solid-dielectric switch for a reliable single action Marx generator operation. The low-profile shape of the capacitor gives it a relatively low inductance, resulting in fast energy delivery and high frequency operation. For example, in one embodiment of the present invention, a 1-cm-tall, 5-cm-diameter disk ceramic capacitor is designed to operate at about 60 to 80 kV and has an intrinsic inductance of about 6.5 nanohenries, and a self resonance frequency of 37 MHz.

The ceramic material 138 has a high dielectric strength resulting in high-voltage operation in a thin, low-profile package. It also has a high-dielectric-constant for relatively high capacitance in a rather small volume and could be comprised of any class of high-permittivity ceramic, including barium-titanate, strontium-titanate, lead-magnesium-niobate, or various other types of ferroelectric materials. For example, in one embodiment of the present invention, a 1-cm-tall, 5-cm-diameter disk capacitor made of N4700-class material meeting EIA standards for X7R ceramic has a capacitance of 2.75 nF at low operating voltages and 1.9 nF operating at electric stress levels of 60 kV/cm. The ceramic material 138 has metalized regions 150 that will be attached to or in direct contact with metal electrodes.

The preferred method of metalizing the surfaces 150 of the ceramic material 138 employs a strictly chemical process for plating copper on surfaces exposed in a chemical bath, also known as electroless chemical plating. Other methods for metalizing surfaces of ceramic dielectric materials can be employed, such as depositing and baking metal-based inks, physical vapor deposition, chemical vapor deposition, plasma-assisted vapor deposition and plasma-arc spraying of metal powders in a vacuum chamber. Other materials for metallic coatings can be employed, such as aluminum, nickel, silver, and gold.

A pair of metal electrodes 142 and 144 are attached to the metalized surfaces 150 of the ceramic substrate 138. The electrodes 142 and 144 are essentially parallel to one another and extend beyond the edges of the dielectric material. The preferred method of attaching the metal electrodes 142 and 144 to the metalized surfaces 150 of the ceramic substrate 138 uses low-temperature solder. Other methods for attaching metal electrodes to the metalized surfaces of the ceramic substrate can be employed, such as metal-based epoxy or flexible conductive layers with some means to apply constant force to achieve a mechanical connection. The extended metal electrode 142 has a radiused corner at the edge 154 to control the electric field at the triple-point junction 158 where three dissimilar materials meet. The objective is to reduce the electric field sufficiently so that electrical breakdown will not occur in the vicinity of the edge of the ceramic dielectric surface.

The ceramic substrate 138 also has a contoured edge 156 shaped to further control the electric field at the triple-point junctions 158 where three dissimilar materials meet and to reduce the electric field sufficiently so that electrical breakdown will not occur in the vicinity of the edge of the ceramic dielectric surface. Alternately, straight edges can be used with some sacrifice in achievable high voltage level and performance, but perhaps with some savings in manufacturing costs.

Different means are available by which to manufacture ceramic substrates of high quality and to machine, grind, or otherwise form contoured shapes along the inner and outer edges. Such methods include 1) hydraulic pressing of ceramic powders into pill-shaped substrates followed by sintering at high temperature, then machining or grinding the surfaces to the final shape, 2) hydraulic pressing of multiple stacked layers of sections of thin ceramic tape, followed by sintering at high temperature, then machining or grinding the surfaces to the final shape, and 3) isostatic pressing of ceramic powder mixed with binding agents to form disks or cylinders of ceramic 'greenware' which is subsequently machined to near net shape, followed by sintering at high temperature, then machining or grinding to the final shape.

Figure 5A:
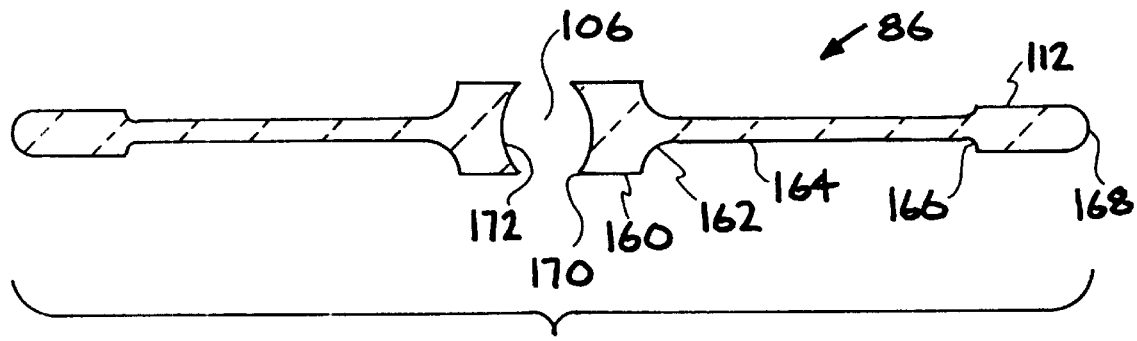
FIG. 5A is a cross sectional diagram of a low-profile compact gas switch suitably shaped to be integrated with low-profile annular capacitors.

FIG. 5A is a cross sectional diagram of a low-profile compact gas switch 86 suitably shaped to be integrated with low-profile annular capacitors. The low-profile shape gives it a very low inductance resulting in fast switching action, fast energy delivery, and high frequency operation of the switch and ultra-compact Marx unit. The dielectric material 112 has high dielectric strength resulting in high voltage operation in a thin, low-profile package. For example, in one embodiment of the present invention, the dielectric switch made to match 5-cm-diameter annular capacitors operates at about 60–80 kV and is 1.5-mm thick over the major portion of its surface has an inductance of about 2 nanohenries. The material can be plastic, ceramic, or other dielectric so long as it is machineable or formable with suitable shapes and contours as described below. Polycarbonate, acrylic, acrylonitrile-butadiene-styrene (ABS), and alumina-trihydrate (ATH) loaded epoxy have all been tested and found to work satisfactorily with varying degrees of performance.

The dielectric switch body 112 is annular shaped with an interior cavity region 106 whereby pressurized gas can be introduced through and contained by adjoining metal electrodes. A pair of metal electrodes sandwich the dielectric switch body and are essentially parallel to one another over the major surface area of the dielectric switch body. The electrodes can be separate pieces individually attached to the dielectric switch body, or the metal electrodes 94 and 96 can be attached to adjacent capacitors and placed in contact with the dielectric switch body as shown in FIG. 3. The surfaces 160, 162, 164, and 166 of the dielectric switch body are suitably shaped to match the shape of the metal electrodes and allow the major surface region 164 to be relatively thin and highly stressed electrically, but also with regions 160 and 166 where the thickness of the dielectric switch body increases to reduce the electrical stress at the triple-point junctions where three dissimilar materials meet. The outermost edge 168 is typically radiused, and it may also have indentations or slots at particular circumferential locations for positioning or registering the switch with other parts like the feed-forward capacitors or the outermost housing of the entire Marx generator assembly.

Surfaces 160, 162, 164, and 166 of the dielectric switch housing that will be in direct contact with an adjoining metal electrode are metalized such that conductor-to-conductor contact is made between the electrodes and the metalized surface of the switch body, rather that between the electrodes and the bare dielectric material itself. The preferred method of metalizing the surfaces employs a strictly chemical process for plating copper on surfaces exposed in a chemical bath, also known as electroless chemical plating. Other methods for metalizing surfaces of ceramic dielectric materials can be employed, such as depositing and baking metal-based inks, physical vapor deposition, chemical vapor deposition, plasma-assisted vapor deposition and plasma-arc spraying of metal powders in a vacuum chamber. Other materials for metallic coatings can be employed, such as aluminum, nickel, silver, and gold.

Raised portions on the metal electrodes (108 and 110 as shown in FIG. 3) protrude from the main electrodes into the gas containing cavity of the dielectric switch body, and serve as the essential electrode regions between which a spark discharge occurs during the gas switch operation. These raised 'button' electrodes are also suitably shaped to reduce the electric field in the corner region 170 where the dielectric switch cavity wall intersects with the metal electrode (110 as shown in FIG. 3) and the interior cavity region 106 forming a triple-point junction of three dissimilar materials. The wall 172 of the gas filled cavity region of the dielectric switch body is contoured so as to reduce the electric field at the triple-point junction where three dissimilar materials meet, and ensure that electrical breakdown will not occur in the vicinity of the exposed edge of the dielectric surface.

The dielectric housing of the compact gas switch must be manufactured by a means that permits three-dimensional shapes to be made precisely and reproduced consistently. Such methods include machining with precision machine control and injection molding.

Figure 5B:
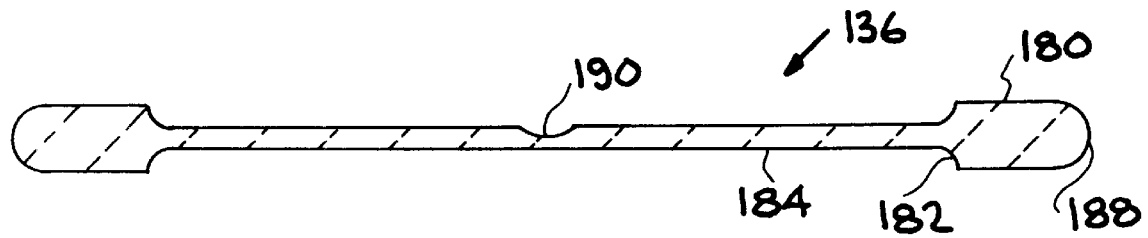
FIG. 5B is a cross sectional diagram of a low-profile solid-dielectric switch suitably shaped to be integrated with low-profile disk capacitors.

FIG. 5B is a cross sectional diagram of a low-profile solid-dielectric switch 136 suitably shaped to be integrated with low-profile disk capacitors. Such a switch provides reliable single-action operation for high performance single-shot operation of the ultra-compact Marx. The very low-profile shape gives it extremely low inductance resulting in fast switching action, fast energy delivery, and high frequency operation of the switch and the ultra-compact Marx generator. For example, in one embodiment of the present invention, the dielectric switch made to match 5-cm-diameter disk capacitors operates at about 60–80 kV and is 1-mm thick over the major portion of its surface has an inductance of about 0.65 nanohenries. The dielectric switch is comprised of a thin disk 180 of known material having high electrical strength and suitably shaped to be sandwiched between low-profile disk-shaped energy-storage capacitors 132 and 134 (as shown in FIG. 6) There is a controlled region 190 resembling a dimple shape, preferably near the center of the disk, where the thickness is reduced so the electrical stress is enhanced and moderately exceeds the nominal stress level throughout the major portion of dielectric material. The dimpled region is where an electrical breakdown of the dielectric material will occur with a sufficiently high applied voltage. The dielectric material 180 has high dielectric strength resulting in high voltage operation in a thin, low-profile package. The material can be plastic, ceramic, or other dielectric so long as it is machineable or formable with suitable shapes and contours as described below. Polycarbonate, acrylic, acrylonitrile-butadiene-styrene (ABS), and alumina-trihydrate (ATH) loaded epoxy have all been tested and found to work satisfactorily with varying degrees of performance.

The dielectric switch body 180 is sandwiched between a pair of metal electrodes that are essentially parallel to one another over the major surface area of the dielectric switch body. The electrodes can be separate pieces individually attached to the dielectric switch body, or the metal electrodes (144 and 146 as shown in FIG. 6B) can be attached to adjacent capacitors and placed in contact with the dielectric switch body. The surfaces 182, and 184 of the dielectric switch body are suitably shaped to match the shape of the adjoining metal electrode and allow the major surface region 184 where electrodes will be attached to be relatively thin and highly stressed electrically, but also with the region 182 where the thickness of the dielectric switch body increases to reduce the electrical stress where the electrode ends. The outermost edge 188 is typically radiused, and it may also have indentations or slots at particular circumferential locations for positioning or registering the switch with other parts like the feed-forward capacitors or the outermost housing of the entire Marx generator assembly.

Surfaces 182 and 184 of the dielectric switch that will be in direct contact with metal electrodes are metalized such that conductor-to-conductor contact is made between the electrodes and the metalized surface of the switch body, rather that between the electrodes and the bare dielectric material itself.

Figure 5C:
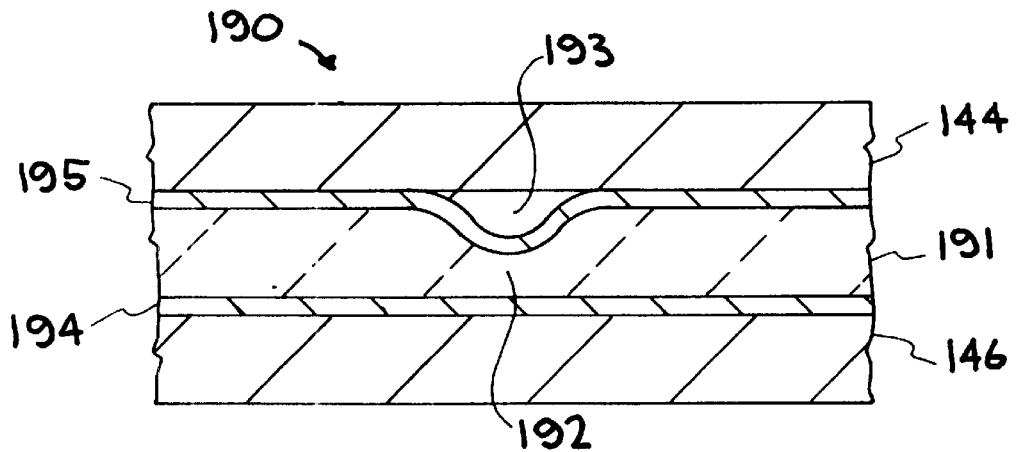
FIG. 5C is a cross sectional diagram illustrating details of the dimple region of the solid-dielectric switch.

FIG. 5C is a cross sectional diagram illustrating details of the dimple region 190 of the solid-dielectric switch. The main dielectric switch body 191 is about one millimeter thick over the major surface region between adjoining metal electrodes 144 and 146. The dielectric material is made thinner at a particular location 192 where the dielectric is intended to break down with a sufficiently high voltage applied. The top and bottom surfaces of the dielectric switch have a metallic coating 195 and 194 that determine the electric field profile in the small dimple region 192. The thickness of the dimple region 192 depends on the intended breakdown level and properties of the material selected for the dielectric switch. As an example, in one embodiment using ABS plastic and operation at 130 kV the thickness of the dimple region is about 0.254 millimeters. Forming the dimple in the dielectric material creates a void region 193 which may become filled with a material of unknown properties. However, because the metalized surface 195 is in direct contact with the adjoining metal electrode 144, electric fields are eliminated from this void region 193, thereby making the void inconsequential.

Different methods are available to manufacture the disk shaped switch body with dimpled region. The preferred method uses injection molding of plastic resins of known properties. Other methods, such as machining or grinding plastic sheets could be used if sufficient precision and reproducibility can be achieved. Using the injection molding method, a solid-dielectric switch having an overall height of one millimeter and nominal operating level of 100 kV has proved to function quite reliably with a standard deviation in operating voltage of less than 6.8 percent. Manufacturing controls play a critical role in production, and a variance from the established process may adversely effect the performance. Visual screening techniques are quite valuable, but may not be sufficient to screen out all substandard components. Nondestructive evaluation methods such as acoustic sensing and x-ray imaging have been found most helpful for qualifying parts.

The preferred method of metalizing the dielectric surfaces employs a strictly chemical process for plating copper on surfaces exposed in a chemical bath, also known as electroless chemical plating. Other methods for metalizing surfaces of dielectric materials can be employed, such as depositing and baking metal-based inks, physical vapor deposition, chemical vapor deposition, plasma-assisted vapor deposition and plasma-arc spraying of metal powders in a vacuum chamber. Other materials for metallic coatings can be employed, such as aluminum, nickel, silver, and gold.

Figure 6A:
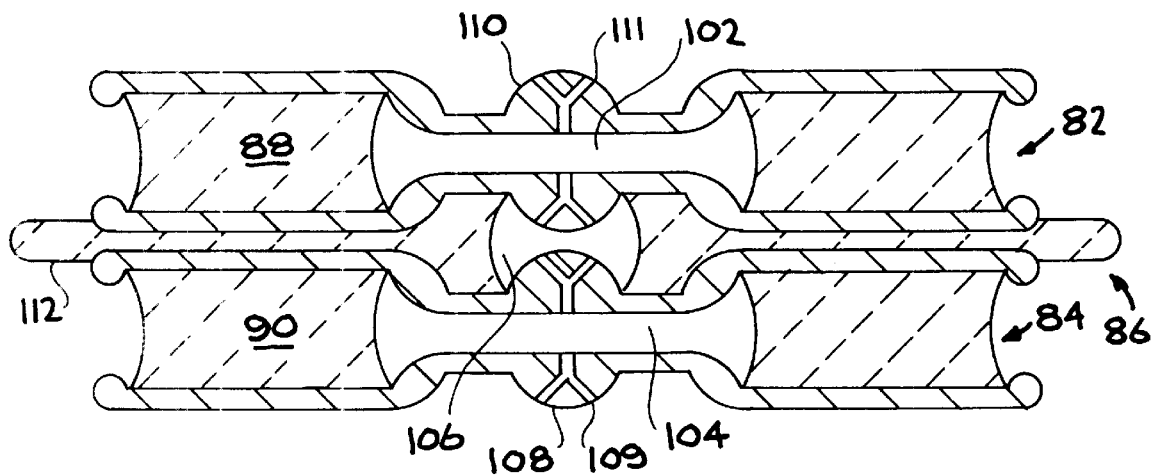
FIG. 6A is a cross sectional diagram illustrating a circuit with a low-profile compact gas switch sandwiched between a pair of low-profile annular capacitors in a circuit embodiment of the present invention.
Figure 6B:
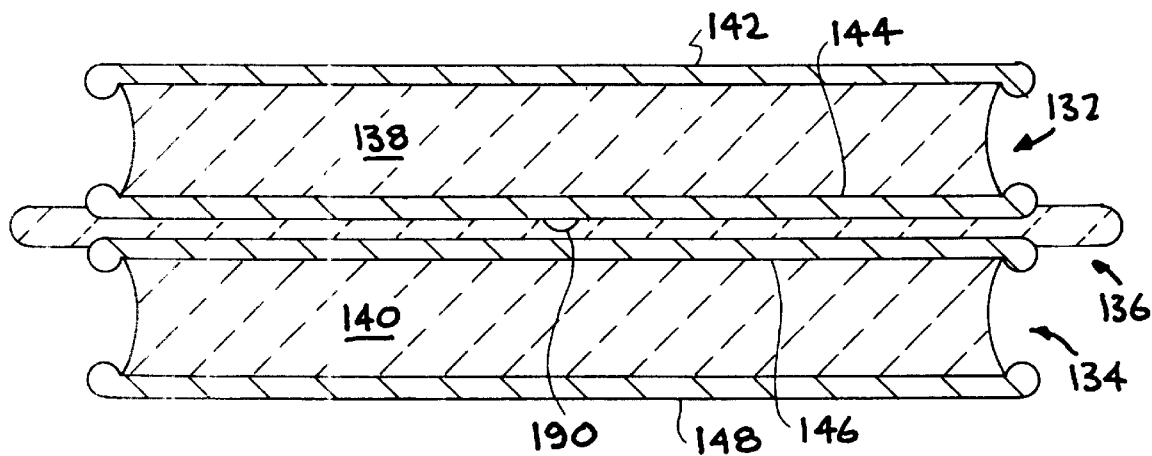
FIG. 6B is a cross sectional diagram illustrating a circuit with a low-profile solid-dielectric switch sandwiched between a pair of low-profile disk capacitors in a circuit embodiment of the present invention.

FIG. 6A is a cross sectional diagram illustrating a circuit with a low-profile compact gas switch sandwiched between a pair of low-profile annular capacitors in a circuit embodiment of the present invention. The gas switch 86 provides isolation between the two capacitors 82 and 84 while they are being charged in a parallel configuration. When the switch operates the bottom electrode of the upper capacitor and the top electrode of the lower capacitor are effectively connected electrically. The switch operates when the gas in region 106 between the narrowest portion of the two button electrodes breaks down because the local electric field exceeds the electrical strength of the gas. The electrical strength is determined by the species and pressure of the gas. The button electrodes 108 and 110 have gas channels 109 and 111 machined or otherwise formed in and through them so that gas can be introduced and expelled from the cavity region 106 and the gas pressure can be set or adjusted to vary operating voltage levels. The gas flows through cavity regions 102 and 104 within the annular capacitors 82 and 84; however, the spacing between the capacitor electrodes is sufficiently great that the electrical stress in these cavity regions is sufficiently reduced so that the gas will not breakdown which would short circuit the capacitors.

FIG. 6B is a cross sectional diagram illustrating a circuit with a low-profile solid-dielectric switch sandwiched between a pair of low-profile disk capacitors in a circuit embodiment of the present invention. The solid dielectric switch 136 provides isolation between the two capacitors 132 and 134 while they are being charged in a parallel configuration. When the switch operates the bottom electrode 144 of the upper capacitor 132 and the top electrode 146 of the lower capacitor 134 are effectively connected electrically. The switch operates when the dielectric in the controlled region 190 breaks down because the local electric field exceeds the electrical strength of the dielectric material. The solid dielectric switch is inherently a single action device, and thus a sacrificial unit that must be replaced after each use.

Charging components should be arranged so as to apply a voltage to charge the main energy storage capacitors in a parallel configuration. Different arrangements of charging components can be used to charge the energy storage capacitors with a single polarity dc power supply or with two supplies of opposite polarities. These components should be of sufficiently high impedance to not impair operation of the Marx generator or divert excessive amounts of energy during the time period in which the energy is being delivered by the Marx generator to the load. The charging components can be resistors or inductors. Resistors are typically used when the Marx generator is to deliver a high voltage output for a relative long pulse length and when energy dissipation in the resistors is not a concern. Inductors are typically used when the Marx generator is to deliver a high voltage output for a relatively short pulse length, and for repetitive operation when the energy storage capacitors must be rapidly recharged for repeated Marx output at relatively fast repetition rates.

Discrete 'feed-forward' coupling capacitors should be attached across successive switch-capacitor-switch stages in a fashion that will couple a portion of the energy released from the operation of one switch so as to increase the voltage across the next in-line switch, thereby causing the voltage across the gap of the next switch to exceed the electrical strength of the gas in that switch and initiating its operation. The size and capacitance of the forward coupling capacitors must be sufficiently large to develop a sufficiently high voltage across the next in-line switch to make it operate. This typically requires a 30 to 50 percent increase above the nominal charge voltage. A reasonably large value of capacitance is required to overcome the relatively high capacitance of the low-profile, low-inductance switches. High-dielectric-strength material is used for high-voltage operation in a relatively low-profile package. High-dielectric-constant material is used for relatively high capacitance in a rather small volume. Suitable materials include any class of high-permittivity ceramic, including barium titanate, strontium titanate, lead-magnesium-niobate, or various other types of ferroelectric materials.

In summary:

The Ultra-Compact Marx High Voltage Generator may include:

- high-energy-density capacitors which are the primary energy storage components
- low-profile, low-inductance switches that permit fast energy delivery and high frequency operation, including two particular versions:
  - compact gas switch for repetitive operation
  - compact dielectric switch for single-action operation
- forward coupling capacitors that assist in successive operation of in-line switches
- charging components arranged to charge primary energy storage capacitors in a parallel configuration and permitting subsequent switching operation of said capacitors in a series configuration.

The Primary energy storage capacitors may include the following features:

- a thin, low-profile shape for very low inductance, resulting in fast energy delivery and high frequency operation.
- high-dielectric-strength material for high-voltage operation in a thin, low-profile package; particularly.
- high-dielectric-constant material for relatively high capacitance in a rather small volume.
- suitable materials include any class of high-permittivity ceramic, including barium titanate, strontium titanate, lead-magnesium-niobate, or various other types of ferroelectric materials.
- annular shape for use with low-profile imbedded gas switch in repetitively operated ultra-compact Marx applications.
- disk shape for use with low-profile dielectric switch in single-shot, ultra-compact Marx applications.
- metalized regions over surfaces of dielectric material that will be attached or in direct contact with metal electrodes.
- one method of metalizing surfaces of ceramic dielectric material that employs a strictly chemical process for plating copper on surfaces exposed in a chemical bath, also known as electroless chemical plating. Other methods for metalizing surfaces of ceramic dielectric materials can be employed, such as depositing and baking metal-based inks, physical vapor deposition, chemical vapor deposition, plasma-assisted vapor deposition, plasma-arc spraying of metal powders in a vacuum chamber. Other materials for metallic coatings can be employed, such as aluminum, nickel, silver, and gold.
- a pair of metal electrodes that are essentially parallel to one another and extend beyond the edges of the dielectric material.
- one method of attaching the metal electrodes to the metalized surfaces of the ceramic substrate using low-temperature solder. Other methods for attaching metal electrodes to the metalized surfaces of the ceramic substrate can be employed, such as metal-based epoxy or flexible conductive layers with some means to apply constant force to achieve a mechanical connection.
- radiused corners at the edges of the extended electrodes shaped so as to control the electric field at the triple-point junction where three dissimilar materials meet and to reduce the electric field sufficiently so that electrical breakdown will not occur in the vicinity of the edge of the ceramic dielectric surface.
- contoured edges of the ceramic dielectric material shaped to control the electric field at the triple-point unction where three dissimilar materials meet and to reduce the electric field sufficiently so that electrical breakdown will not occur in the vicinity of the edge of the ceramic dielectric surface. Alternately, straight edges can be used with some sacrifice in achievable high voltage level and performance, but perhaps with some savings in manufacturing costs.
- a means by which to manufacture ceramic substrates of high quality and methods to machine, grind, or otherwise form contoured shapes along the inner and outer edges. Such methods include:
- hydraulic pressing of ceramic powders into pill shaped substrates followed by sintering at high temperature, then machining or grinding surface to the final shape.
- hydraulic pressing of multiple stacked layers of sections of thin ceramic tape, followed by sintering at high temperature, then machining or grinding surface to the final shape.
- isostatic pressing of ceramic powder mixed with binding agents to form disks or cylinders of ceramic 'greenware' which is subsequently machined to near net shape, followed by sintering at high temperature, then machining or grinding to the final shape.

The Compact gas switch may include following features:

- low profile shape for very low inductance, fast switching action, fast energy delivery, and high frequency operation of the switch and ultra-compact Marx unit.
- high-dielectric strength material for high voltage operation in a thin, low-profile package. The materials can be plastics, ceramics, or other dielectrics so long as they are machineable or formable with suitable shapes and contours as described below. Polycarbonate, acrylic, acrylonitrile-butadiene-styrene (ABS), and alumina-trihydrate (ATH) loaded epoxy have all been tested and found to work satisfactorily with varying degrees of performance.
- a dielectric switch body suitably shaped to provide an interior cavity region whereby pressurized gas can be introduced and contained.
- an annular shaped dielectric switch body whereby the gas containing region is in the immediate vicinity of the centerline of the device.
- a pair of metal electrodes that are essentially parallel to one another over the major surface area of the dielectric switch body, and are suitable shaped to match the shaped to match the shape of the dielectric switch body over the major potion of the switch surface. The electrodes can be separate pieces individually attached to the dielectric switch body, or the metal electrodes can be attached to the capacitors and placed in contact with the dielectric switch body.

surfaces of the dielectric switch body that are suitably shaped to match the shape of the metal electrodes and allow the major surface region where electrodes will be attached to be relatively thin and highly stressed electrically, but also with regions where the thickness of the dielectric switch body increases to reduce the electrical stress at the triple-point junctions where three dissimilar materials meet.

metalized regions over surfaces of dielectric material that will be in direct contact with metal electrodes, such that conductor-to-conductor contact is made between the electrodes and the metalized surface of the switch body, rather that between the electrodes and the bare dielectric material itself.

raised portions on the metal electrodes, or separately attached 'button' electrodes that protrude from the main electrodes into the gas containing cavity of the dielectric switch body, and which serve as the essential electrode regions between which a spark discharge occurs during the gas switch operation. These raised 'button' electrodes are also suitably shaped to reduce the electric field in the corner region where the dielectric switch cavity wall intersects forming a triple-point junction of three dissimilar materials.

a contoured edge along the wall of the gas filled cavity region of the dielectric switch body, suitable shaped to reduce the electric field at the tripe-point junction where three dissimilar materials meet, so that electrical breakdown will not occur in the vicinity of the exposed edge of the dielectric surface.

gas channels machined or otherwise formed in and through the metal electrodes to introduce and expel gas to and from the cavity region of the dielectric switch body.

a means to manufacture said dielectric switch housing that permits three-dimensional shapes to be made precisely and reproduced consistently. Such methods can include machining with precision machine control and injection molding.

The Dielectric switch may include the following features:

reliable single-action operation for high performance single-shot operation of the ultra-compact Marx a very low-profile shape for extremely low inductance, fast energy delivery and high frequency operation of the ultra-compact Marx.

a thin disk of known material having high electrical strength and suitably shaped to be sandwiched between low-profile disk-shaped energy-storage capacitors.

a controlled region resembling a dimple shape, preferably near the center of the disk, where the thickness is reduced so the electrical stress is enhanced and moderately exceeds the nominal stress level throughout the major portion of dielectric material. The dimpled region is where an electrical breakdown of the dielectric material will occur with a sufficiently high applied voltage.

a means by which to manufacture the disk shaped switch body with dimpled region. The preferred means being by injection molding of plastic resins of known properties. Other methods, such as machining or grinding plastic sheets could be used if sufficient precision and reproducibility can be achieved.

surfaces of the dielectric switch body that are suitably shaped to match the shape of the metal electrodes and allow the major surface region where electrodes will be attached to be relatively thin and highly stressed electrically, but also with regions near the outer diameter where the thickness of the dielectric switch body increases to reduce the electrical where the electrodes end.

metalized surfaces on both sides of the dielectric substrate surfaces where they will be in direct contact with adjoining metal electrodes, thereby eliminating any electric fields that would otherwise exist in the gap between the dielectric and the adjoining electrodes, thus avoiding electrical breakdown of any weaker dielectric, typically gas or liquid, that might reside in said gap.

The Feed-forward coupling capacitors may include the following features:

discrete 'feed-forward' coupling capacitors attached across successive switch-capacitor-switch stages in a fashion that will couple a portion of the energy released from the operation of one switch so as to increase the voltage across the next in-line switch, thereby causing the voltage across the gap of the next switch to exceed the electrical strength of the gas in that switch and initiating its operation.

the size and capacitance of the forward coupling capacitors must be sufficiently large to develop a sufficiently high voltage across the next inline switch to make it operate. This typically requires a 30 to 50 percent increase above the nominal charge voltage. A reasonably large value of capacitance is required to overcome the relatively high capacitance of the low-profile, low-inductance switches.

high-dielectric-strength material for high-voltage operation in a relatively low-profile package;

high-dielectric-constant material for relatively high capacitance in a rather small volume.

suitable materials include any class of high-permittivity ceramic, including barium titanate, strontium titanate, lead-magnesium-niobate, or various other types of ferroelectric materials.

The charging components may be:

arranged so as to apply a voltage to charge the main energy storage capacitors in a parallel configuration.

different arrangements of charging components can be used to charge the energy storage capacitors with a single polarity dc power supply or with two supplies of opposite polarities.

of sufficiently high impedance to not impair operation of the Marx generator or divert excessive amounts of energy during the time period in which the energy is being delivered by the Marx generator to the load.

the charging components can be resistors or inductors. Resistors are typically used when the Marx generator is to deliver a high voltage output for a relative long pulse length and when energy dissipation in the resistors is not a concern. Inductors are typically used when the Marx generator is to deliver a high voltage output for a relatively short pulse length, and for repetitive operation when the energy storage capacitors must be rapidly recharged for repeated Marx output at relatively fast repetition rates.

In an additional embodiment, the invention may include means to produce compact high-voltage structures whereby any electric field in the otherwise weak area between an adjoining metal electrode and a solid dielectric substrate is eliminated by metalizing the surface of the dielectric substrate wherever it will be in direct contact with the adjoining metal electrode.

In another additional embodiment, the invention may include means to produce compact high-voltage structures whereby the electric field in the triple-point region where three dissimilar materials meet is reduced sufficiently to prevent breakdown in the weaker material by optimally shaping both the electrode and dielectric materials in the vicinity of the triple point region.

Changes and modifications in the specifically described embodiments can be carried out without departing from the scope of the invention, which is intended to be limited by the scope of the appended claims.

The invention claimed is:

1. An ultra-compact Marx-type high voltage generator, comprising:

a plurality of high-energy-density capacitors which are the primary energy storage component of the generator, wherein said plurality of high-energy-density capacitors comprise electrodes having extended portions for making electrical connections with leads or tabs from the side as required for coupling and charging components, said electrodes further comprising a raised region in the center of said electrode;

a plurality of low-profile, low-inductance switches comprising a central void and a peripheral portion of solid dielectric material, wherein said switches are sandwiched between said high-energy-density capacitors and in direct electrical contact with said electrodes of adjoining high-energy-density capacitors to provide electrical isolation of said high-energy-density capacitors during charging, to permit fast energy delivery between said high-energy-density capacitors during operation, and to provide high frequency operation of said generator;

a plurality of forward coupling capacitors attached by electrical leads or tabs to said extended electrodes of said high-energy-density capacitors, and connected across successive switch-capacitor-switch stages, whereby they couple a portion of the energy released by the operation of one switch to nearby switches causing the nearby switches to operate in a successive fashion;

a plurality of charging components attached by electrical leads or tabs to said extended electrodes of said high-energy-density capacitors, arranged so as to charge said high-energy-density capacitors in a parallel configuration and permit subsequent switching operation of said high-energy-density capacitors into a series configuration, and of sufficiently high impedance to provide stage-to-stage isolation and not impair operation of said generator; and a plurality of metalized surfaces on said solid dielectric material of said switches where they will be in direct contact with an adjoining metal electrode to eliminate electric fields from space where voids or imperfections which would cause failure of said solid dielectric material.

2. The ultra-compact Marx-type high voltage generator of claim 1, wherein each switch of said low-profile, low-inductance switches comprises a compact gas switch for repetitive operation.

3. The ultra-compact Marx-type high voltage generator of claim 1, wherein each switch of said low-profile, low-inductance switches comprises a compact dielectric switch for single-action operation.

4. The ultra-compact Marx-type high voltage generator of claim 1, wherein each high-energy-density capacitor of said plurality of high-energy-density capacitors comprises a thin, low-profile shape for very low inductance, resulting in fast energy delivery and high frequency operation.

5. The ultra-compact Marx-type high voltage generator of claim 1, wherein each high-energy-density capacitor of said plurality of high-energy-density capacitors comprises high-dielectric-strength material for high-voltage operation in a thin, low-profile package, wherein said high-dielectric-strength material comprises high-dielectric-constant material for relatively high capacitance in a rather small volume.

6. The ultra-compact Marx-type high voltage generator of claim 1, wherein each high-energy-density capacitor of said plurality of high-energy-density capacitors comprises high-permittivity ceramic.

7. The ultra-compact Marx-type high voltage generator of claim 1, wherein each high-energy-density capacitor of said plurality of high-energy-density capacitors comprises high-permittivity ceramic selected from a group consisting of barium titanate, strontium titanate, lead-magnesium-niobate, or ferroelectric materials.

8. The ultra-compact Marx-type high voltage generator of claim 1, wherein each forward coupling capacitor of said plurality of forward coupling capacitors comprises discrete 'feed-forward' coupling capacitors attached across successive switch-capacitor-switch stages in a fashion that will couple a portion of the energy released from the operation of one switch so as to increase the voltage across the next in-line switch, thereby causing the voltage across the gap of the next switch to exceed the electrical strength of the gas in that switch and initiating its operation.

9. The ultra-compact Marx-type high voltage generator of claim 1, wherein each forward coupling capacitor of said plurality of forward coupling capacitors is sufficiently large to develop a sufficiently high voltage across the next in-line switch to make it operate.

10. The ultra-compact Marx-type high voltage generator of claim 1, wherein each forward coupling capacitor of said plurality of forward coupling capacitors comprises high-dielectric-strength material for high-voltage operation in a relatively low-profile package.

11. The ultra-compact Marx-type high voltage generator of claim 1, wherein each forward coupling capacitor of said plurality of forward coupling capacitors comprises high-dielectric-constant material for relatively high capacitance in a rather small volume.

12. The ultra-compact Marx-type high voltage generator of claim 1, wherein each low-profile, low-inductance switch of said plurality of low-profile, low-inductance switches comprises a compact gas switch.

13. The ultra-compact Marx-type high voltage generator of claim 12, wherein said compact gas switch comprises a low profile shape for very low inductance, fast switching action, fast energy delivery, and high frequency operation of the switch and ultra-compact Marx unit.

14. The ultra-compact Marx-type high voltage generator of claim 12, wherein said compact gas switch comprises a high-dielectric strength material for high voltage operation in a thin, low-profile package.

15. The ultra-compact Marx-type high voltage generator of claim 12, wherein said compact gas switch comprises a high-dielectric strength material selected from a group consisting of plastics, ceramics and dielectrics.

16. The ultra-compact Marx-type high voltage generator of claim 1, wherein said dielectric switch comprises a thin disk of known material having high electrical strength and suitably shaped to be sandwiched between said low-profile disk-shaped energy-storage capacitors.

17. The ultra-compact Marx-type high voltage generator of claim 1, wherein said dielectric switch comprises a controlled region resembling a dimple shape, preferably near the center of the disk, where the thickness is reduced so the electrical stress is enhanced and moderately exceeds the nominal stress level throughout the major portion of dielectric material, wherein said dimpled region is where an electrical breakdown of the dielectric material will occur with a sufficiently high applied voltage.

18. The ultra-compact Marx-type high voltage generator of claim 1, wherein said dielectric switch comprises surfaces of the dielectric switch body that are suitably shaped to match the shape of the metal electrodes and allow the major surface region where electrodes will be attached to be relatively thin and highly stressed electrically, but also with regions near the outer diameter where the thickness of the dielectric switch body increases to reduce the electrical where the electrodes end.

19. The ultra-compact Marx-type high voltage generator of claim 1, wherein said dielectric switch comprises metalized surfaces on both sides of the dielectric substrate surfaces where they will be in direct contact with adjoining metal electrodes, thereby eliminating any electric fields that would otherwise exist in the gap between the dielectric and the adjoining electrodes, thus avoiding electrical breakdown of any weaker dielectric, typically gas or liquid, that might reside in said gap.

20. The ultra-compact Marx-type high voltage generator of claim 1, wherein said charging components comprise sufficiently high impedance to not impair operation of the Marx generator or divert excessive amounts of energy during the time period in which the energy is being delivered by the Marx generator to the load.

21. The ultra-compact Marx-type high voltage generator of claim 1, wherein said charging components comprise charging components selected from a group consisting of resistors and inductors, wherein resistors are typically used when the Marx generator is to deliver a high voltage output for a relative long pulse length and when energy dissipation in the resistors is not a concern and inductors are typically used when the Marx generator is to deliver a high voltage output for a relatively short pulse length, and for repetitive operation when the energy storage capacitors must be rapidly recharged for repeated Marx output at relatively fast repetition rates.

22. A Marx-type high voltage generator, comprising:
  a plurality of capacitors, wherein each capacitor of said plurality of capacitors comprises a ceramic substrate and a pair of metal electrodes that sandwich said ceramic substrate and extend beyond the edge of said ceramic substrate;
  a plurality of solid dielectric switches, wherein each switch of said plurality of solid dielectric switches comprises a substrate of dielectric material having high electrical strength, wherein said substrate comprises a central region wherein the thickness of said dielectric material is reduced to enhance electrical stress such that said electrical stress exceeds the stress level throughout the remaining portions of said substrate, wherein each switch is sandwiched between two capacitors of said plurality of capacitors;
  means for coupling a portion of the energy released by the operation of one switch to nearby switches causing the nearby switches to operate in a successive fashion;
  means for charging said plurality of capacitors in a parallel configuration; and
  means for switching operation of said capacitors into a series configuration for discharge.

23. The Marx-type high voltage generator of claim 22, wherein said pair of metal electrodes are parallel to one another.

24. The Marx-type high voltage generator of claim 22, wherein said ceramic substrate is perpendicular to said metal electrodes.

25. The Marx-type high voltage generator of claim 22, wherein said edge of said ceramic substrate comprises radiused corners.

26. The Marx-type high voltage generator of claim 22, wherein said edge of said ceramic substrate is contoured.

27. The Marx-type high voltage generator of claim 22, wherein said ceramic substrate comprises surfaces that are metalized wherever they will be in direct contact with said metal electrodes such that conductor-to-conductor contact is made between said metal electrodes and the metalized surface of said ceramic substrate.

28. The Marx-type high voltage generator of claim 22, wherein each capacitor of said plurality of capacitors comprises a thin, low-profile shape for very low inductance, resulting in fast energy delivery and high frequency operation.

29. The Marx-type high voltage generator of claim 22, wherein each capacitor of said plurality of capacitors comprises high-dielectric-strength material for high-voltage operation in a thin, low-profile package, wherein said high-dielectric-strength material comprises high-dielectric-constant material.

30. The Marx-type high voltage generator of claim 22, wherein each capacitor of said plurality of capacitors comprises high-permittivity ceramic.

31. The Marx-type high voltage generator of claim 30, wherein said high-permittivity ceramic is selected from a group consisting of barium titanate, strontium titanate, lead-magnesium-niobate and ferroelectric materials.

32. The Marx-type high voltage generator of claim 22, wherein said central region comprises a dimple shape.

33. The Marx-type high voltage generator of claim 22, wherein each solid dielectric switch of said plurality of solid dielectric switches comprises metalized surfaces on both sides of said dielectric material where they will be in direct contact with each electrode of said pair of metal electrodes.

34. The Marx-type high voltage generator of claim 22, wherein each electrode of said pair of metal electrodes are attached to adjacent electrodes.

35. The Marx-type high voltage generator of claim 22, wherein said substrate of dielectric material comprises a disk shape.

\* \* \* \* \*